United States Patent
Finley

[19]

[11] Patent Number: 5,902,505
[45] Date of Patent: May 11, 1999

[54] HEAT LOAD REDUCTION WINDSHIELD

[75] Inventor: James Joseph Finley, Pittsburgh, Pa.

[73] Assignee: PPG Industries, Inc., Pittsburgh, Pa.

[21] Appl. No.: 08/139,260

[22] Filed: Oct. 20, 1993

Related U.S. Application Data

[63] Continuation of application No. 07/333,068, Apr. 3, 1989, which is a continuation-in-part of application No. 07/176,979, Apr. 4, 1988, Pat. No. 4,898,789.

[51] Int. Cl.⁶ .................................. B60L 1/02; H05B 3/02
[52] U.S. Cl. ............................ 219/547; 219/203; 219/219
[58] Field of Search ..................................... 219/547, 203, 219/219; 428/623; 204/192.1, 192.28

[56] References Cited

U.S. PATENT DOCUMENTS

| | | | |
|---|---|---|---|
| 4,094,763 | 6/1978 | Gillery et al. | 240/192.29 |
| 4,113,599 | 9/1978 | Gillery | 204/192.13 |
| 4,166,018 | 8/1979 | Chapin | 204/192.12 |
| 4,201,649 | 5/1980 | Gillery | 204/192.12 |
| 4,327,967 | 5/1982 | Groth | 359/591 |
| 4,349,425 | 9/1982 | Miyake et al. | 204/192.29 |
| 4,413,877 | 11/1983 | Suzuki et al. | 359/360 |
| 4,462,883 | 7/1984 | Hart | 204/192.26 |
| 4,497,700 | 2/1985 | Groth et al. | 204/192.27 |
| 4,507,547 | 3/1985 | Taga et al. | 219/543 |
| 4,548,691 | 10/1985 | Dietrich et al. | 204/192.27 |
| 4,594,137 | 6/1986 | Gillery | 428/426 |
| 4,610,771 | 9/1986 | Gillery | 204/192.1 |
| 4,716,086 | 12/1987 | Gillery et al. | 428/630 |
| 4,782,216 | 11/1988 | Woodard | 219/547 |
| 4,820,902 | 4/1989 | Gillery | 219/203 |
| 4,828,346 | 5/1989 | Jacobson et al. | 350/1.7 |

FOREIGN PATENT DOCUMENTS

| | | | |
|---|---|---|---|
| 0 031 278 | 7/1981 | European Pat. Off. . | |
| 0 183 052 | 6/1986 | European Pat. Off. | 204/192.1 |
| 0 226 993 | 7/1987 | European Pat. Off. | 428/630 |
| 0 233 003 | 8/1987 | European Pat. Off. . | |
| 0 275 474 | 7/1988 | European Pat. Off. . | |
| 2273777 | 4/1975 | France . | |

*Primary Examiner*—Teresa Walberg
*Assistant Examiner*—Daniel Leon Robinson
*Attorney, Agent, or Firm*—Kenneth J. Stachel; Donald C. Lepiane

[57] ABSTRACT

A multiple-layer, high transmittance, low emissivity coated article is disclosed comprising at least two infrared reflective metal layers alternatingly combined with at least three metal oxide antireflective layers to produce a coating with superior low emissivity and low visible reflectance, especially for use to reduce heat load in automobiles, wherein the coating furthermore is electroconductive for use in an electrically heatable transparency.

3 Claims, 2 Drawing Sheets

HEAT LOAD REDUCTION WINDSHIELD

CROSS-REFERENCE TO RELATED APPLICATION

This is a continuation of application Ser. No. 07/333,068, filed Apr. 3, 1989, which is a continuation-in-part of application Ser. No. 176,979 filed Apr. 4, 1988, U.S. Pat. No. 4,898,789.

BACKGROUND OF THE INVENTION

This invention relates to a heat load reduction film in an electrically heated transparency such as may be employed in a vehicle to provide defrosting, deicing, or defogging capability.

It is known to pass electric current through a transparent conductive coating on a transparency in order to raise the temperature of the transparency. Generally, a source of electrical potential is connected to the conductive coating by way of a pair of bus bars along opposite sides of the area of the transparency to be heated. The bus bars have low resistivity relative to the coating and are intended to distribute the current evenly over the area to be heated. The bus bars may be comprised of metallic foil strips, but in the case of glass transparencies they preferably are comprised of a metallic-ceramic frit material fused onto a surface of the transparency.

A typical arrangement includes bus bars configured as substantially parallel stripes on opposite sides of the heated area, with electrical leads attached to each bus bar and extending away from the opposite edges of the transparency as shown in U.S. Pat. Nos. 4,323,726 to Criss et al and 4,668,270 to Ramus. Locating the leads on the same side of the transparency and preferably closely adjacent to each other is advantageous for the sake of easier installation of the transparency in the vehicle and simplifying the connection with the electrical power source as shown in U.S. Pat. Nos. 3,895,213 to Levin and 4,543,466 to Ramus.

A preferred bus bar arrangement involves connection of the remote bus bar to the electrical circuit by way of two conductive extensions of the bus bar, each extending from opposite ends of the remote bus bar along opposite ends of the transparency as described in U.S. Ser. No. 138,008 filed Dec. 28, 1987. The conductive extensions are insulated from the conductive coating on the transparency, preferably by omitting or deleting the coating in the marginal area near the extensions.

U.S. Pat. No. 4,094,763 to Gillery et al discloses producing transparent, electroconductive articles by cathode sputtering metals such as tin and indium onto refractory substrates such as glass at a temperature above 400° F. in a low pressure atmosphere containing a controlled amount of oxygen.

U.S. Pat. No. 4,113,599 to Gillery teaches a cathode sputtering technique for the reactive deposition of conductive indium oxide in which the flow rate of oxygen is adjusted to maintain a constant discharge current while the flow rate of argon is adjusted to maintain a constant pressure in the sputtering chamber.

U.S. Pat. No. 4,462,883 to Hart discloses a low emissivity coating produced by cathode sputtering a layer of silver, a small amount of metal other than silver, and an antireflection layer of metal oxide onto a transparent substrate such as glass. The antireflection layer may be tin oxide, titanium oxide, zinc oxide, indium oxide, bismuth oxide or zirconium oxide.

High transmittance, low emissivity coatings as described above generally comprise a thin metallic layer, for infrared reflectance and low emissivity, sandwiched between dielectric layers of metal oxides to reduce the visible reflectance. These multiple layer films are typically produced by cathode sputtering, especially magnetron sputtering. The metallic layer may be gold or copper, but is generally silver. The metal oxide layers described in the prior art include tin oxide, indium oxide, titanium oxide, bismuth oxide, zinc oxide, zirconium oxide and lead oxide. In some cases, these oxides incorporate small amounts of other metals, such as manganese in bismuth oxide, indium in tin oxide and vice versa, to overcome certain disadvantages such as poor durability or marginal emissivity. However, all of these metal oxides have some deficiency.

U.S. Pat. No. 4,610,771 to Gillery, the disclosure of which is incorporated herein by reference, provides a novel film composition of an oxide of a zinc-tin alloy, as well as a novel multiple-layer film of silver and zinc-tin alloy oxide layers for use as a high transmittance, low emissivity coating.

While multiple-layer, low-emissivity, high transmittance films have been made sufficiently durable for architectural applications in multiple glazed window units, such films were not sufficiently temperature-resistant to withstand high temperature processing, such as bending, tempering or laminating. Moreover, it is desirable to have a coating which serves both as a low emissivity film to reduce heat gain in an enclosed space and as a current-carrying heatable film for defogging, defrosting or deicing a transparency, particularly in a vehicle.

SUMMARY OF THE INVENTION

Figure 1:
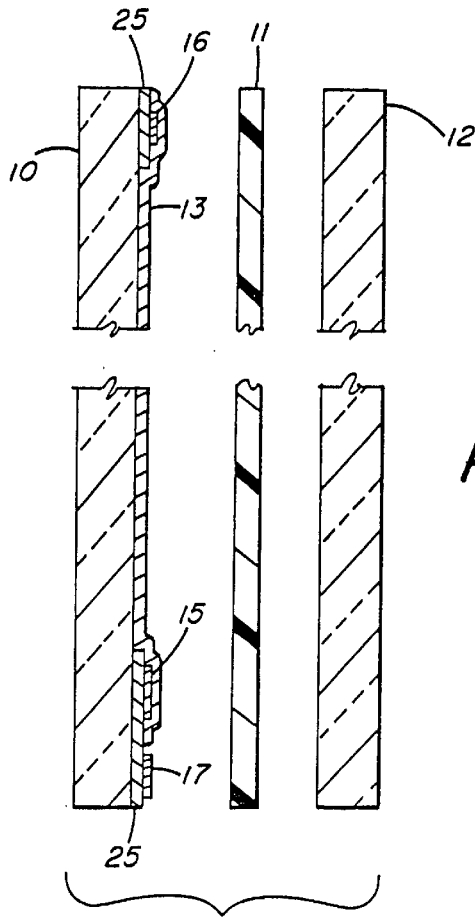
FIG. 1 is an exploded, cross-sectional, enlarged view of a typical laminated windshield construction of the present invention.

The present invention involves a multiple-layer coating which provides superior heat load reduction to a transparency, especially for use as an automotive windshield without distracting visible reflectance, and can be connected to a power source for heating. The multiple-layer coating of the present invention comprises a first antireflective metal oxide layer such as an oxide of zinc and tin, an infrared reflective metal layer such as silver, a primer layer containing titanium, a second thicker metal oxide layer, another infrared reflective metal layer such as silver, an additional primer layer, a third antireflective metal oxide layer, and, preferably, an exterior protective layer of titanium metal or titanium oxide.

DETAILED DESCRIPTION OF THE PREFERRED EMBODIMENTS

A film composition preferably comprising an oxide of a metal or metal alloy is preferably deposited by cathode sputtering, preferably magnetron sputtering. A cathode target is prepared comprising the desired metal or metal alloy elements. The target is then sputtered in a reactive atmosphere, preferably containing oxygen in order to deposit a metal or metal alloy oxide film on a surface of a substrate.

A preferred metal alloy oxide in accordance with the present invention is an oxide of an alloy comprising zinc and tin. A zinc/tin alloy oxide film may be deposited in accordance with the present invention by cathode sputtering, preferably magnetically enhanced. Cathode sputtering is also a preferred method for depositing high transmittance, low emissivity films in accordance with the present invention. Such films typically comprise multiple layers, preferably a layer of a highly reflective metal such as gold or silver sandwiched between antireflective metal oxide layers such as indium oxide or titanium oxide, or preferably an oxide of an alloy of zinc and tin which preferably comprises zinc stannate.

While various metal alloys may be sputtered to form metal alloy oxide films, in order to produce a preferred high transmittance, low emissivity multiple layer film in accordance with the present invention, alloys of tin and zinc are preferred. A particularly preferred alloy comprises zinc and tin, preferably in proportions of 10 to 90 percent zinc and 90 to 10 percent tin. A preferred zinc/tin alloy ranges from 30 to 60 percent zinc, preferably having a zinc/tin ratio from 40:60 to 60:40. A most preferred range is 46:54 to 50:50 by weight tin to zinc. A cathode of zinc/tin alloy reactively sputtered in an oxidizing atmosphere results in the deposition of a metal oxide layer comprising zinc, tin and oxygen, preferably comprising zinc stannate, $Zn_2SnO_4$.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises a metal alloy such as zinc/tin which is sputtered in a reactive atmosphere to form a metal alloy oxide film. The anode is preferably a symmetrically designed and positioned assembly as taught in U.S. Pat. No. 4,478,702 to Gillery et al, the disclosure of which is incorporated herein by reference.

In a preferred embodiment of the present invention, a multiple layer film is deposited by cathode sputtering to form a high transmittance, low emissivity coating. In addition to the metal alloy target, at least one other cathode target surface comprises a metal to be sputtered to form a reflective metallic layer. At least one additional cathode target surface comprises the titanium to be sputtered to deposit a titanium oxide layer. A durable multiple layer coating having two reflective metallic films in alternating combination with three antireflective metal alloy oxide films is produced as follows, using a titanium oxide primer layer to improve the adhesion between the metal and metal oxide films, which primer layer also provides high-temperature resistance to the multiple-layer coating in accordance with the present invention so that the resultant coated article may be subjected to high temperature processing, such as bending, annealing, tempering, laminating, or glass welding without deterioration of the coating.

The thickness of the primer layer of the present invention is preferably at least 10 Angstroms, limited only by the desired transmittance of the film, more preferably about 12 to 30 Angstroms. If a single primer layer is deposited over the reflective metal film, the thickness is preferably greater than 20 Angstroms. If the thickness of the primer layer over the reflective metal layer is less than 20 Angstroms, preferably an additional primer layer is deposited between the first antireflective metal oxide layer and the infrared reflective metal layer.

A clean glass substrate is placed in a coating chamber which is evacuated, preferably to less than $10^{-4}$ torr, more preferably less than $2\times10^{-5}$ torr. A selected atmosphere of inert and reactive gases, preferably argon and oxygen, is established in the chamber to a pressure between about $5\times10^{-4}$ and $10^{-2}$ torr. A cathode having a target surface of zinc/tin metal is operated over the surface of the substrate to be coated. The target metal is sputtered, reacting with the atmosphere in the chamber to deposit a zinc/tin alloy oxide coating layer on the glass surface.

After the initial layer of zinc/tin alloy oxide is deposited, the coating chamber is evacuated, and an inert atmosphere such as pure argon is established at a pressure between about $5\times10^{-4}$ and $10^{-2}$ torr. Preferably, a cathode having a target surface of titanium is sputtered to deposit a first titanium metal primer layer over the zinc/tin alloy oxide layer. In an alternative embodiment, the titanium cathode may be sputtered in a slightly oxidizing atmosphere to deposit a titanium oxide primer layer over the zinc/tin alloy oxide layer. A cathode having a target surface of silver is then sputtered to deposit a reflective layer of metallic silver over the primer layer. A second primer layer is preferably deposited by sputtering titanium over the reflective silver layer. Again, the titanium may be sputtered in an inert atmosphere to deposit a metallic titanium primer layer, or in a slightly oxidizing atmosphere to deposit a titanium oxide primer layer. Next, a second layer of zinc/tin alloy oxide is deposited over the second primer layer under essentially the same conditions used to deposit the first zinc/tin alloy oxide layer, except that the thickness of this layer is approximately double the thickness of the first. Preferably, another primer layer is deposited, followed by a second infrared reflective metal layer, preferably yet another primer layer, then a third antireflective metal oxide layer of about the same thickness as the first, and finally, preferably, a protective film such as titanium oxide, the thickness of which is limited only by the desired final transmittance of the coating.

In most preferred embodiments of the present invention, a protective overcoat is deposited over the final antireflective metal oxide film. The protective overcoat is preferably deposited by sputtering over the antireflective metal oxide film a layer of a metal such as disclosed in U.S. Pat. No. 4,594,137 to Gillery et al. Preferred metals for the protective overcoat include alloys of iron or nickel, such as stainless steel or Inconel. Titanium is a most preferred overcoat because of its high transmittance. In an alternative embodiment, the protective layer may be a particularly chemical resistant material such as titanium oxide as disclosed in U.S. Pat. No. 4,716,086 to Gillery et al, the disclosure of which is incorporated herein by reference.

The chemical resistance of a multiple layer film is most improved by depositing a protective coating comprising titanium oxide over the multiple layer film. Preferably, the titanium oxide protective coating is deposited by cathode sputtering at a relatively high deposition rate and low pressure, preferably about 3 millitorr. A protective coating comprising titanium oxide may be formed by sputtering titanium in an oxygen-sufficient atmosphere to deposit titanium oxide directly. In an alternative embodiment of the present invention, a protective coating comprising titanium oxide may be formed by sputtering titanium in an inert atmosphere to deposit a titanium-containing film which subsequently oxidizes to titanium oxide upon exposure to an oxidizing atmosphere such as air.

Similarly, if the primer layers of the present invention are deposited in an inert atmosphere as titanium metal, subsequent high temperature processing results in oxidation of the metal to form titanium oxide.

The coated glass is then preferably fabricated to form a laminated transparency comprised of two plies of glass bonded together by an interlayer of plastic, since that is the typical windshield construction. However, it should be understood that the invention applies as well to heated transparencies involving a single ply of glass with a single ply off plastic, all plastic laminations, and other combinations. The laminate need not be used as an automobile windshield, but may be a back or side window, sunroof or any transparency for any vehicle, including aircraft, or any other enclosed space.

As shown in FIG. 1, the transparency is preferably comprised of an outboard glass sheet 10, a plastic interlayer 11 which may be polyvinylbutyral as is commonly used for laminated windshields or other suitable interlayer material, and an inboard sheet of glass 12. A coating 13 of the present invention is preferably placed on a surface that is not exposed, most preferably on the inboard side of the outboard glass sheet 10. The silver acts as the conductive layer and the zinc stannate films serve to mask the reflectance of the silver. The coating exhibits appropriate resistivity for use as a heated windshield when the silver layer has a thickness of about 110 angstroms, for example.

Figure 2:
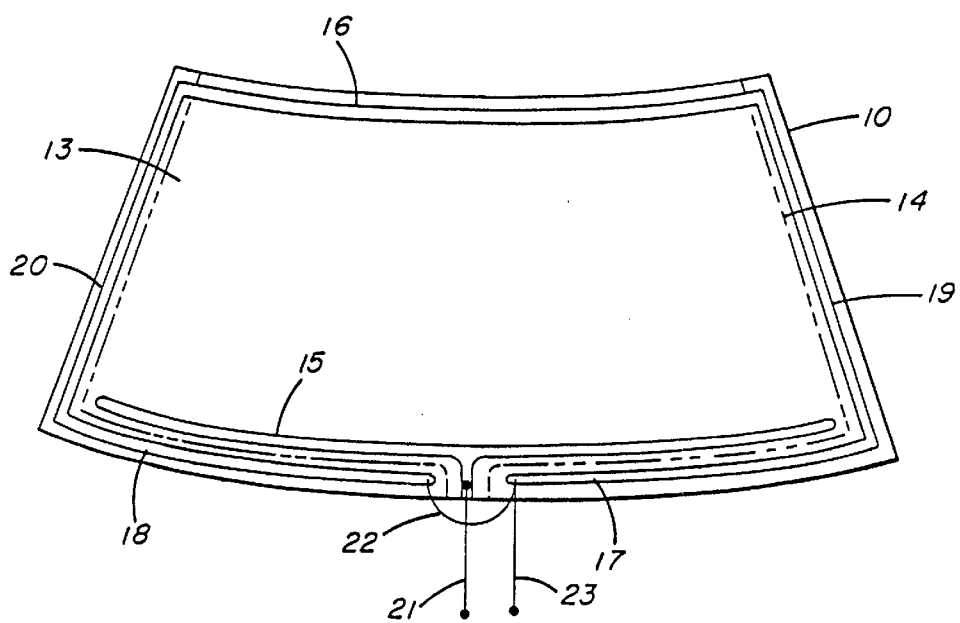
FIG. 2 is a schematic, elevational view of a windshield incorporating a preferred bus bar arrangement.

An optional feature shown in FIG. 1, but omitted from FIG. 2 for the sake of clarity, is an opaque border 25 which may be ceramic enamel applied to the flat glass surface by silk screening and fired on during the heating of the sheet for bending. The opaque border 25 serves to conceal attachment means and other elements when installed in a vehicle, and may also conceal the bus bars of the heating circuit.

Referring now to FIGS. 1 and 2, the electrical connections to the heated windshield embodiment shown are at the lower edge, at the center portion thereof. It should be understood that the connections could be at any edge, and at an off-center location such as a corner region. A bottom bus bar 15 and top bus bar 16 are in contact with the coating 13. Line 14 indicates an edge of the coating 13 spaced from the sides and bottom edges of the transparency, leaving an uncoated margin along three sides thereof. The uncoated marginal areas may be created by masking those areas during the coating process. Optionally the entire sheet could be coated and the coating subsequently deleted from those areas. The uncoated marginal areas permit connections to be made to the upper bus bar 16 without contact with the coating 13. As shown in FIG. 2, the connections to the upper bus bar include two conductive strips 17 and 18 extending in opposite directions along the bottom edge of the transparency from the terminal area, and side strips 19 and 20 extending along opposite side portions which connect strips 17 and 18 to opposite ends of the upper bus bar 16. The bus bars and the conductive strips may be made of the ceramic frit material containing silver well known in the art and which may be silk screened onto the glass surface (or onto the opaque border 25) and fused by heating. The conductivity of the bus bars and the conductive strips is chosen to be considerably greater than that of the coating 13. Electrical lead 21 connects the lower bus bar to one pole of an electrical power source, and strips 17 and 18 leading to the upper bus bar may be wired in common to the opposite pole by means of a jumper wire 22 and lead 23.

Figure 3:
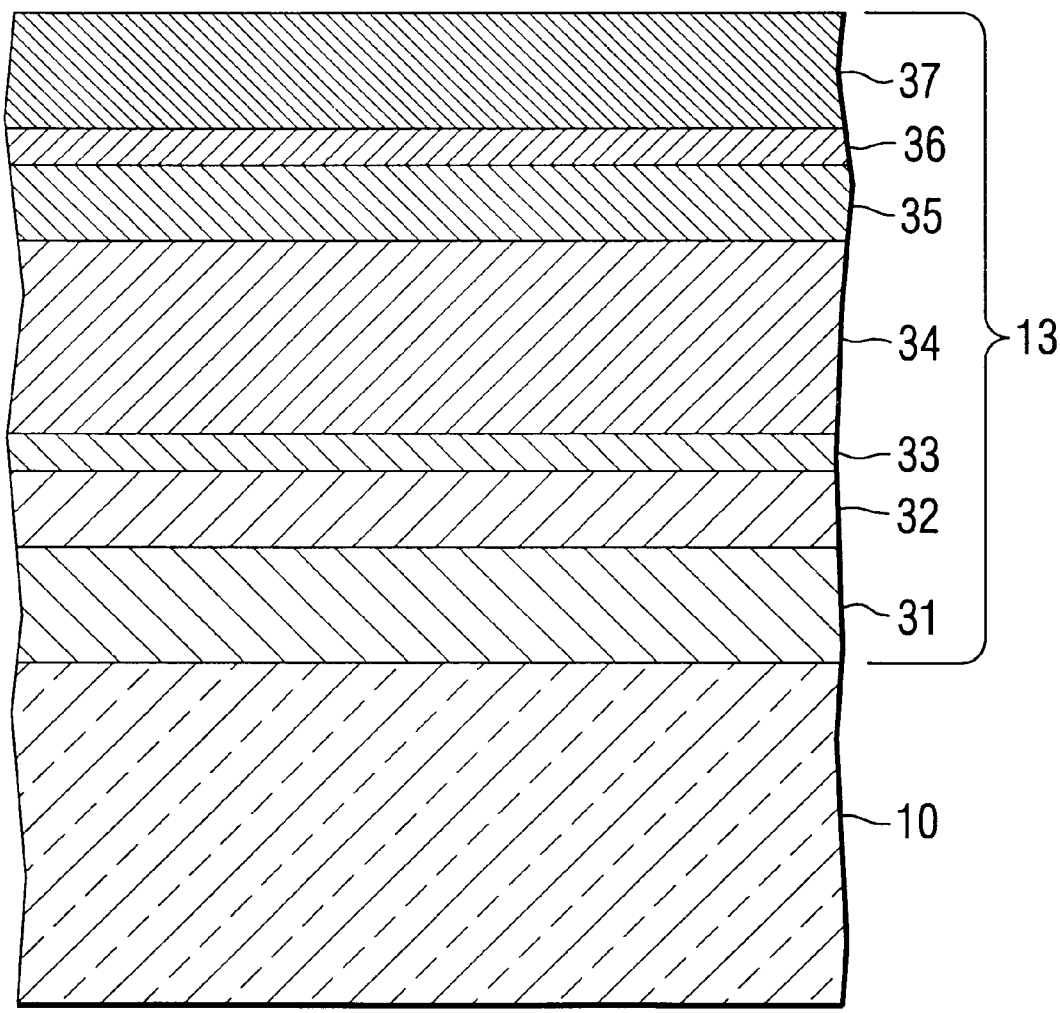
FIG. 3 is a cross-sectional, enlarged view, not to scale, of the coating in FIGS. 1 and 2.

Referring now to FIG. 3, glass substrate 10 is coated with a multilayer film 13 comprising a first transparent metal oxide layer 31; a first transparent, infrared reflective, electroconductive metallic layer 32; a transparent, metal-containing primer layer 33; a second transparent metal oxide layer 34; a second transparent, infrared reflective metal layer 35; a second transparent, metal-containing primer layer 36; and a third transparent, antireflective metal oxide layer 37.

The present invention will be further understood from the description of a specific example which follows. In the example, the zinc/tin alloy oxide film is referred to as zinc stannate although the film composition need not be precisely $Zn_2SnO_4$.

EXAMPLE

A multiple layer film is deposited on a soda-lime silica glass substrate to produce a high transmittance, low emissivity coated product. A stationary cathode measuring 5 by 17 inches (12.7 by 43.2 centimeters) comprises a sputtering surface of zinc/tin alloy consisting of 52.4 weight percent zinc and 47.6 percent tin. A soda-lime-silica glass substrate is placed in the coating chamber which is evaluated to establish a pressure of 4 millitorr in an atmosphere of 50/50 argon/oxygen. The cathode is sputtered in a magnetic field at a power of 1.7 kilowatts while the glass is conveyed past the sputtering surface at a rate of 120 inches (3.0 meters) per minute. A film of zinc stannate is deposited on the glass surface. Three passes produce a film thickness of about 300 Angstroms, resulting in a decrease in transmittance from 90 percent for the glass substrate to 84 percent for the zinc stannate coated glass substrate. Next, a layer of silver is deposited over the titanium primer layer by sputtering a silver cathode target in an atmosphere of argon gas at a pressure of 4 millitorr. With the substrate passing under the silver cathode target at the same rate, two passes are necessary to deposit 100 Angstroms of silver, further reducing the transmittance to 66 percent. A titanium primer layer 15 Angstroms thick is sputtered over the silver layer, decreasing the transmittance to 56.5 percent. Then the second antireflective layer of zinc stannate is deposited, 600 Angstroms thick, increasing the transmittance to 73 percent, followed by a second 100 Angstrom thick silver layer, which decreases the transmittance to 69.5 percent. A final titanium primer layer 15 Angstroms thick decreases the transmittance to 58 percent, after which a final 300 Angstrom thick zinc stannate antireflective layer is deposited which increases the transmittance finally to 78 percent.

Optionally, a stationary titanium cathode measuring 5 by 17 inches (12.7 by 43.2 centimeters) is sputtered at 10 kilowatts in an atmosphere comprising equal volumes of argon and oxygen at a pressure of 3 millitorr to deposit a protective coating of titanium oxide about 15 to 20 Angstroms thick. The protective coating of titanium oxide does not significantly affect the resistance and reflectance properties of the multiple-layer coating, and changes the transmittance no more than about one percent.

The improved durability of the coated article resulting from the improved adhesion between the metal and metal oxide films as a result of the primer layers of the present invention is readily demonstrated by a simple abrasion test consisting of wiping the coated surface with a damp cloth. A surface coated with zinc stannate/silver/zinc stannate having no primer layers increases in reflectance from about 6 percent to about 18 percent after several passes of a damp cloth, indicating removal of both the top zinc stannate and the underlying silver films. In contrast, prolonged vigorous rubbing with a damp cloth produces no visible change in a zinc stannate/titanium/silver/titanium/zinc stannate/titanium/silver/titanium/zinc stannate/titanium oxide coated article of the present invention.

Preferred titanium oxide protective coatings have thicknesses in the range of about 10 to 50 Angstroms. Thicker film s may be used, limited only by the desired transmittance. With a titanium oxide protective coating about 20 Angstroms thick, the durability of a multiple layer coating in accordance with this example is increased from 2 hours to 22 hours in a 2½ percent salt solution at ambient temperature, and from 5 hours to one week in the Cleveland humidity test conducted with a Q-Panel Cleveland Condensation Tester Model QCT-ADO containing deionized water at 150° F. (about 66° C.).

A typical coated article of the present invention comprising two 90 Angstrom thick silver infrared reflective layers transmits 40 percent and reflects 30 percent of total solar energy compared with total solar energy transmittance of 45 percent and total solar energy reflectance of 27 percent for a standard low emissivity coating containing a single layer of silver and having the same luminous transmittance of about 73 percent. In addition, the visible reflectance of the coating of this example is 8 percent and neutral compared to 14 percent and bronze for a standard low emissivity coating having about 130 Angstroms of silver in a single layer. The above optical properties are measured after lamination of a coated clear glass sheet to a tinted glass sheet.

The above example is offered to illustrate the present invention. Various modifications of the product and the process are included. For example, other coating compositions are within the scope of the present invention. Depending on the proportions of zinc and tin when a zinc/tin alloy is sputtered, the coating may contain widely varying amounts of zinc oxide and tin oxide in addition to zinc stannate. The primer layers may comprise titanium metal in various states of oxidation. Other metals such as zirconium, chromium and zinc/tin alloy are also useful as primers in accordance with the present invention. The thicknesses of the various layers are limited primarily by the desired optical properties such as transmittance. More than two infrared reflective layers alternating with more than three antireflective layers may also be used, again depending on the desired optical properties. Process parameters such as pressure and concentration of gases may be varied over a broad range. Protective coatings of other chemically resistant materials may be deposited as either metal or oxides. The coatings of the present invention may be applied to flat glass which is subsequently subjected to high temperature processing such as tempering and bending as well as lamination. The description of a windshield has been set forth herein with reference to a particular embodiment for the sake providing the best mode of practicing the invention, but it should be understood that variations and modifications known to those in the art may be employed without departing from the scope of the invention as defined by the claims that follow.

I claim:

1. An electrically heatable transparency comprising a glass sheet, a transparent electroconductive coating on a major surface of the sheet, a first bus bar in contact with the coating along a first edge portion of the sheet, a second bus bar in contact with the coating along a second edge portion of the sheet opposite the first edge portion, an electroconductive extension extending from each end of the second bus bar to the first edge portion along third and fourth edge portions respectively, the extensions being electrically insulated from the coating, wherein the coating comprises:

a. a first transparent antireflective metal oxide film of an oxide reaction product of zinc and tin deposited on a surface of said glass sheet;

b. a primer layer of titanium on said first transparent antireflective film;

c. a transparent infrared reflective silver film deposited on said antireflective metal oxide layer;

d. a first transparent metal-containing primer layer comprising titanium deposited on said infrared reflective metallic film; and e. a second transparent antireflective metal oxide film of an oxide reaction product of zinc and tin on said primer film; in combination with f. a second transparent metal-containing primer layer comprising titanium on said second antireflective metal oxide film;

g. a second transparent infrared reflective silver film deposited on said second transparent titanium primer film;

h. a third transparent metal-containing primer layer comprising titanium deposited on said second infrared reflective silver layer; and i. a third transparent antireflective metal oxide film of an oxide reaction product of zinc and tin deposited on said third primer layer, and j. a protective metal-containing overcoat deposited over said third antireflective metal oxide film.

2. A method for fabricating an electrically heatable coated glass transparency for heat load reduction comprising the steps of:

a. sputtering a metal in a reactive atmosphere comprising oxygen thereby depositing a first transparent metal oxide film comprising an oxide reaction product of zinc and tin on a surface of a transparent glass substrate;

b. sputtering a transparent, infrared reflective electroconductive metallic film over said transparent metal oxide film;

c. sputtering a first transparent primer layer comprising titanium over said transparent reflective electroconductive metallic film;

d. sputtering a second transparent metal oxide film comprising an oxide reaction product of zinc and tin over said first primer layer; in combination with the steps of e. sputtering a second transparent primer layer comprising titanium over said second transparent metal oxide film;

f. sputtering a second transparent infrared reflective metal film over said second primer layer;

g. sputtering a third transparent primer layer comprising titanium over said second infrared reflective layer;

h. sputtering a third transparent antireflective metal oxide layer comprising an oxide reaction product of zinc and tin over said third primer layer to produce an electroconductive multilayer coating; and i. depositing a protective metal-containing overcoat deposited over said third antireflective oxide film, and j. applying first and second bus bars to said substrate in contact with said coating.

3. A method for fabricating an electrically heatable coated and laminated transparency comprising the steps of:

a. placing a transparent glass substrate in a sputtering chamber;

b. sputtering zinc and tin in a reactive atmosphere comprising oxygen to deposit a first transparent zinc/tin oxide film on a surface of said substrate;

c. sputtering titanium to deposit a first primer layer on said oxide film;

d. sputtering silver in an inert atmosphere to deposit a first transparent silver film on said primer layer;

e. sputtering titanium to deposit a second primer layer on said first silver film;

f. sputtering zinc and tin in a reactive atmosphere comprising oxygen to deposit a second zinc/tin oxide film on said second primer layer;

g. sputtering titanium to deposit a third primer layer on said second oxide film;

h. sputtering silver in an inert atmosphere to deposit a second silver film on said third primer layer;

i. sputtering titanium to deposit a fourth primer layer on said second silver layer;

j. sputtering zinc and tin in a reactive atmosphere comprising oxygen to deposit a third zinc/tin oxide film on said fourth primer layer;

k. depositing a metal-containing protective coating over said third metal alloy oxide film;

l. applying first and second bus bars to said substrate in contact with said coating; and m. laminating the coated transparent substrate with a transparent plastic substrate.

* * * * *